(12) United States Patent
Seki et al.

(10) Patent No.: US 10,145,025 B2
(45) Date of Patent: Dec. 4, 2018

(54) METHOD FOR PRODUCING SIC SINGLE CRYSTAL

(71) Applicant: TOYOTA JIDOSHA KABUSHIKI KAISHA, Aichi (JP)

(72) Inventors: Kazuaki Seki, Futtsu (JP); Kazuhiko Kusunoki, Nishinomiya (JP); Kazuhito Kamei, Osaka (JP); Katsunori Danno, Susono (JP); Hironori Daikoku, Susono (JP); Masayoshi Doi, Nagoya (JP)

(73) Assignee: TOYOTA JIDOSHA KABUSHIKI KAISHA, Aichi (JP)

( * ) Notice: Subject to any disclaimer, the term of this patent is extended or adjusted under 35 U.S.C. 154(b) by 0 days.

(21) Appl. No.: 15/558,699

(22) PCT Filed: Mar. 16, 2016

(86) PCT No.: PCT/JP2016/058395
§ 371 (c)(1),
(2) Date: Sep. 15, 2017

(87) PCT Pub. No.: WO2016/148207
PCT Pub. Date: Sep. 22, 2016

(65) Prior Publication Data
US 2018/0112329 A1    Apr. 26, 2018

(30) Foreign Application Priority Data
Mar. 18, 2015    (JP) .................................. 2015-055455

(51) Int. Cl.
*C30B 29/36*    (2006.01)
*C30B 19/10*    (2006.01)
(Continued)

(52) U.S. Cl.
CPC ................ *C30B 19/10* (2013.01); *C30B 9/06* (2013.01); *C30B 19/04* (2013.01); *C30B 29/36* (2013.01);
(Continued)

(58) Field of Classification Search
CPC .................................. C30B 9/00; C30B 29/36
See application file for complete search history.

(56) References Cited

U.S. PATENT DOCUMENTS

2013/0042802 A1*  2/2013  Danno .................... C30B 15/14
                                                                    117/60
2013/0284083 A1*  10/2013  Okada .................... C30B 29/36
                                                                    117/28
(Continued)

FOREIGN PATENT DOCUMENTS

JP    2009-091222    4/2009
JP    2014-019614    2/2014
(Continued)

*Primary Examiner* — Robert M Kunemund
(74) *Attorney, Agent, or Firm* — Clark & Brody

(57) ABSTRACT

Provided is a method for producing a SiC single crystal which can suppress generation of SiC polycrystals. The method according to the present embodiment is in accordance with a solution growth method. The method for producing a SiC single crystal according to the present embodiment comprises a power-output increasing step, a contact step, and a growth step. In the power-output increasing step, high-frequency power output of an induction heating device is increased to crystal-growth high-frequency power output. In the contact step, a SiC seed crystal is brought into contact with a Si—C solution. The high-frequency power output of the induction heating device in the contact step is more than 80% of the crystal-growth high-frequency power output. The temperature of the Si—C solution in the contact step is less than a crystal growth
(Continued)

temperature. In the growth step, the SiC single crystal is grown at the crystal growth temperature.

4 Claims, 5 Drawing Sheets

(51) Int. Cl.
 *H01L 21/02* (2006.01)
 *C30B 9/06* (2006.01)
 *C30B 19/04* (2006.01)
(52) U.S. Cl.
 CPC .. *H01L 21/02378* (2013.01); *H01L 21/02529* (2013.01); *H01L 21/02625* (2013.01); *H01L 21/02628* (2013.01)

(56) References Cited

U.S. PATENT DOCUMENTS

| 2015/0159297 A1* | 6/2015 | Shinya | C30B 13/02 117/35 |
| 2015/0159299 A1* | 6/2015 | Shinya | C30B 13/02 117/35 |

FOREIGN PATENT DOCUMENTS

| JP | 2014-047096 | 3/2014 |
| WO | 2011/007458 | 1/2011 |
| WO | 2012/127703 | 9/2012 |
| WO | 2014/034424 | 3/2014 |

* cited by examiner

WETTING-UP SITE

METHOD FOR PRODUCING SIC SINGLE CRYSTAL

TECHNICAL FIELD

The present invention relates to a method for producing a SiC single crystal, and more specifically to a method for producing a SiC single crystal by a solution growth method.

BACKGROUND ART

The SiC single crystal is a thermally and chemically stable compound semiconductor. The SiC single crystal has excellent physical properties compared to a Si single crystal. For example, the SiC single crystal has a larger band gap, higher insulation breakdown voltage, and higher thermal conductivity compared to a Si single crystal, and has a high saturation velocity of electrons. Therefore, the SiC single crystal is attracting attention as a next-generation semiconductor material.

The SiC exhibits crystal polytypism. Typical crystal structures of SiC are 6H, 4H, and 3C. Among these crystal structures, a SiC single crystal having a crystal structure of 4H has a larger band gap compared with a SiC single crystal having another crystal structure. Therefore, a SiC single crystal having a crystal structure of 4H is desired.

Known methods for producing a SiC single crystal include a sublimation recrystallization method and a solution growth method. In the sublimation recrystallization method, a raw material in a gas phase is fed onto a SiC seed crystal to grow a SiC single crystal.

In the solution growth method, a crystal growth surface of a SiC seed crystal is brought into contact with a Si—C solution and the Si—C solution in the vicinity of the SiC seed crystal is supercooled, and thereby a SiC single crystal grows on the SiC seed crystal. Here, the Si—C solution is a melt of Si or a Si alloy in which carbon (C) is dissolved. In a solution growth method, a graphite crucible is usually used as a container for accommodating the Si—C solution. In the graphite crucible, a raw material containing Si is melted by high-frequency induction heating, etc. to form a melt. In that case, C dissolves into the melt from the graphite crucible. As a result, the melt becomes a Si—C solution. The solution growth method is disclosed in, for example, Japanese Patent Application Publication No. 2009-91222 (Patent Literature 1).

In the solution growth method, melt-back is performed to remove strain and oxide film of the surface of the SiC seed crystal. The melt-back is a method in which the SiC seed crystal is brought into contact with the Si—C solution and then the temperature of the Si—C solution is increased. This causes the concentration of C in the Si—C solution to be unsaturated, thereby partially melting the crystal growth surface of the SiC seed crystal.

However, when the melt-back is performed, the Si—C solution may wet up on the side surface of the SiC seed crystal, or the side surface of a graphite support rod holding the SiC seed crystal. In this case, SiC polycrystals are likely to be generated.

International Application Publication No. 2012/127703 (Patent Literature 2) proposes a method for producing a SiC single crystal, which suppresses generation of SiC polycrystals. In Patent Literature 2, a wetting-up height of a solution onto a side surface of a SiC seed crystal is controlled to be within a range in which the SiC single crystal grown from the crystal growth surface and the SiC single crystal grown from the side surface grow as an integral SiC single crystal. Patent Literature 2 describes that, as a result of that, polycrystallization is suppressed.

CITATION LIST

Patent Literature

Patent Literature 1: Japanese Patent Application Publication No. 2009-91222
Patent Literature 2: International Application Publication No. 2012/127703

However, even in the method for producing a SiC single crystal disclosed in Patent Literature 2 described above, SiC polycrystals may be generated in some cases.

SUMMARY OF INVENTION

An objective of the present invention is to provide a method for producing a SiC single crystal which can suppress generation of SiC polycrystals.

The method for producing a SiC single crystal according to the present embodiment is in accordance with a solution growth method. The method for producing a SiC single crystal according to the present embodiment comprises a power-output increasing step, a contact step, and a growth step. In the power-output increasing step, high-frequency power output of an induction heating device is increased to crystal-growth high-frequency power output. In the contact step, a SiC seed crystal is brought into contact with a Si—C solution. The high-frequency power output of the induction heating device during the contact step is more than 80% of the crystal-growth high-frequency power output. The temperature of the Si—C solution during the contact step is less than a crystal growth temperature. In the growth step, the SiC single crystal is grown at the crystal growth temperature.

The method for producing a SiC single crystal according to the present embodiment can suppress generation of SiC polycrystals.

DESCRIPTION OF EMBODIMENTS

Figure 1:
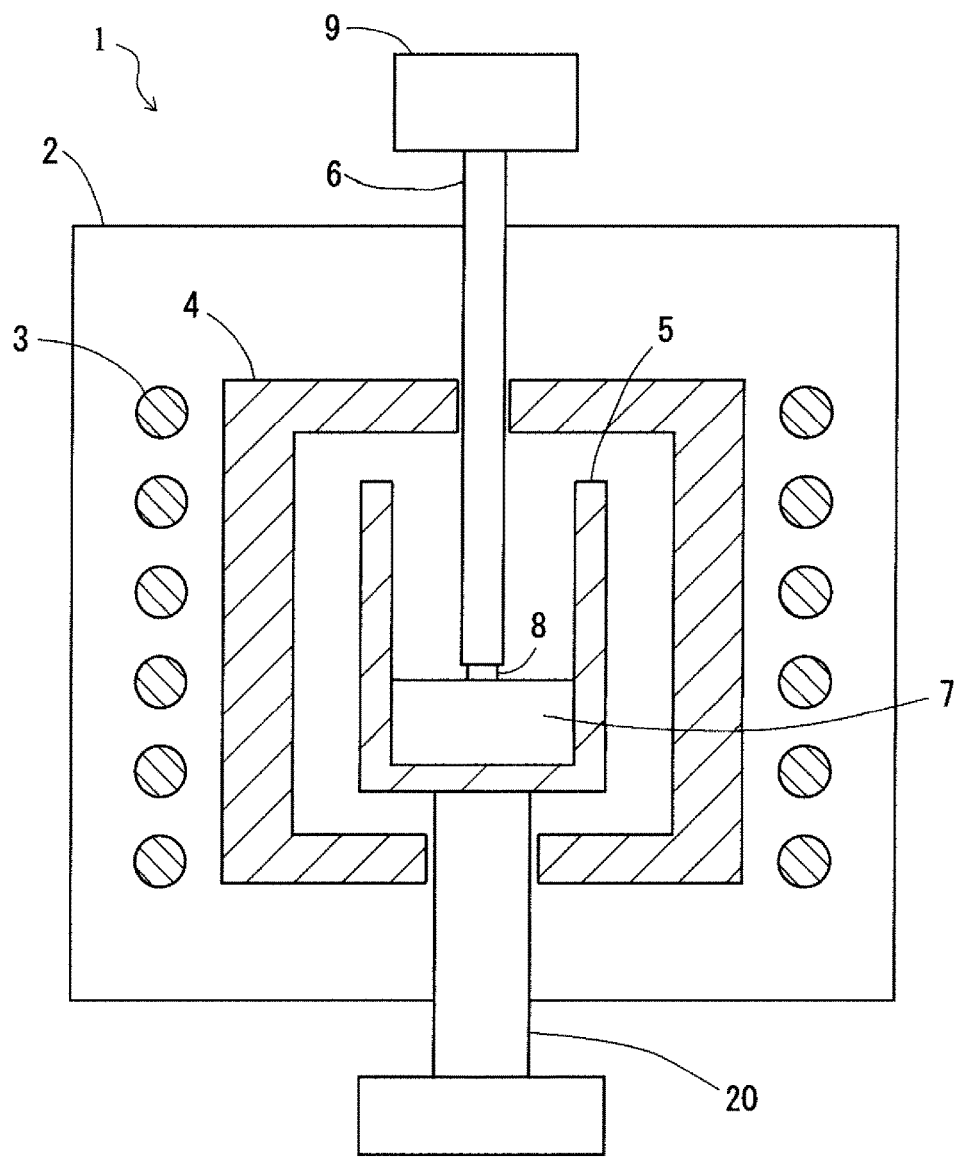
FIG. 1 is a schematic diagram of a production apparatus of a SiC single crystal according to the present embodiment.

The method for producing a SiC single crystal according to the present embodiment is in accordance with a solution growth method. The method for producing a SiC single crystal according to the present embodiment comprises a power-output increasing step, a contact step, and a growth step. In the power-output increasing step, high-frequency power output of an induction heating device is increased to crystal-growth high-frequency power output. In the contact step, a SiC seed crystal is brought into contact with a Si—C solution. The high-frequency power output of the induction heating device in the contact step is greater than 80% of the crystal-growth high-frequency power output. The temperature of the Si—C solution in the contact step is less than a crystal growth temperature. In the growth step, the SiC single crystal is grown at the crystal growth temperature. The term "crystal growth temperature" herein refers to the temperature of the Si—C solution when a Si—C single crystal is grown.

The above described production method may comprise a power-output maintaining step before the contact step and during the power-output increasing step. In the power-output maintaining step, the high-frequency power output of an induction heating device is maintained for a predetermined period of time in a state lower than the crystal-growth high-frequency power output.

The above described production method may further comprise a meniscus forming step after the contact step. In the meniscus forming step, the SiC seed crystal is moved upward to form a meniscus. In this case, it is possible to further suppress generation of SiC polycrystals.

In the above described production method, crystal growth may be performed while increasing the crystal growth temperature, in the growth step. In this case, it is possible to further suppress generation of SiC polycrystals.

Hereinafter, referring to the drawings, the present embodiment will be described in detail. Like or corresponding portions in the drawings are given like reference symbols, and description thereof will not be repeated.

[Production Apparatus]

FIG. 1 is a schematic diagram of an example of a production apparatus 1 to be used in a method for producing a SiC single crystal according to the present embodiment.

The production apparatus 1 includes a chamber 2, a crucible 5, a heat insulation member 4, an induction heating device 3, a rotating device 20, and a seed shaft 6.

The chamber 2 is an enclosure. The chamber 2 accommodates the heat insulation member 4 and the induction heating device 3. The chamber 2 further can accommodate the crucible 5. When a SiC single crystal is produced, the chamber 2 is cooled with a cooling medium.

The crucible 5 is accommodated in the heat insulation member 4 in the form of an enclosure. The crucible 5 is an enclosure whose upper end is opened. The crucible 5 may be provided with a top plate. In this case, it is possible to suppress vaporization of the Si—C solution 7. The crucible 5 accommodates the Si—C solution 7. The Si—C solution 7 is generated by heating and thereby melting a raw material of the Si—C solution 7. The raw material may contain Si alone, or Si and another metal element. Examples of the metal element to be contained in the raw material of the Si—C solution 7 include titanium (Ti), manganese (Mn), chromium (Cr), cobalt (Co), vanadium (V), and iron (Fe).

The crucible 5 preferably contains carbon. In this case, the crucible 5 acts as a carbon source for the Si—C solution 7. More preferably, the starting material of the crucible 5 is graphite. However, the starting material of the crucible 5 may be other than graphite. For example, the starting material of the crucible 5 may be ceramics, a high-melting point metal, or the like. When the crucible 5 cannot be utilized as the carbon source, the raw material of the Si—C solution 7 contains carbon. When the starting material of the crucible 5 is of a material other than graphite, a coating containing graphite may be formed on the inner surface of the crucible 5.

The heat insulation member 4 surrounds the crucible 5. The heat insulation member 4 is made of known heat insulation material. The heat insulation material is, for example, a fiber-based or non-fiber-based molded heat insulation material.

The induction heating device 3 surrounds the heat insulation member 4. The induction heating device 3 includes a high-frequency coil. The high-frequency coil is coaxially disposed with the seed shaft 6. The induction heating device 3 inductively heats the crucible 5 through electromagnetic induction, and melts the raw material accommodated in the crucible 5 to generate the Si—C solution 7. The induction heating device 3 further maintains the Si—C solution 7 at the crystal growth temperature.

The rotating device 20 is a shaft extending in a height direction of the chamber 2. The upper end of the rotating device 20 is disposed inside of the chamber 2. The crucible 5 is disposed on an upper surface of the rotating device 20. The rotating device 20, to which a rotating mechanism is connected, rotates about a central axis of the rotating device 20. Rotation of the rotating device 20 causes the crucible 5 to rotate. The crucible 5 and the rotating device 20 may rotate, or may not rotate.

The seed shaft 6 is a shaft extending in a height direction of the chamber 2. The upper end of the seed shaft 6 is disposed outside of the chamber 2. The seed shaft 6 is attached to a driving source 9 in the outside of the chamber 2. The lower end of the seed shaft 6 is disposed inside of the crucible 5. A Si—C seed crystal 8 is attached to the lower end of the seed shaft 6.

The SiC seed crystal 8 is plate shaped and is made of a SiC single crystal. The SiC single crystal is generated and grown on the surface (crystal growth surface) of the SiC seed crystal 8 when produced by the solution growth method. Preferably, the crystal structure of the SiC seed crystal 8 is the same as that of the SiC single crystal to be produced. For example, when producing a SiC single crystal having a 4H crystal structure, it is preferable to use a SiC seed crystal 8 having the 4H crystal structure.

The seed shaft 6 can be moved up and down, and rotated by the driving source 9. The seed shaft 6 is moved down by the driving source 9 and the SiC seed crystal 8 comes into contact with the Si—C solution 7. The seed shaft 6 is rotated by the driving source 9 and the SiC seed crystal 8 rotates. The seed shaft 6 may, or may not rotate. Preferably, the seed shaft 6 is made of graphite.

[Production Method]

Figure 2:
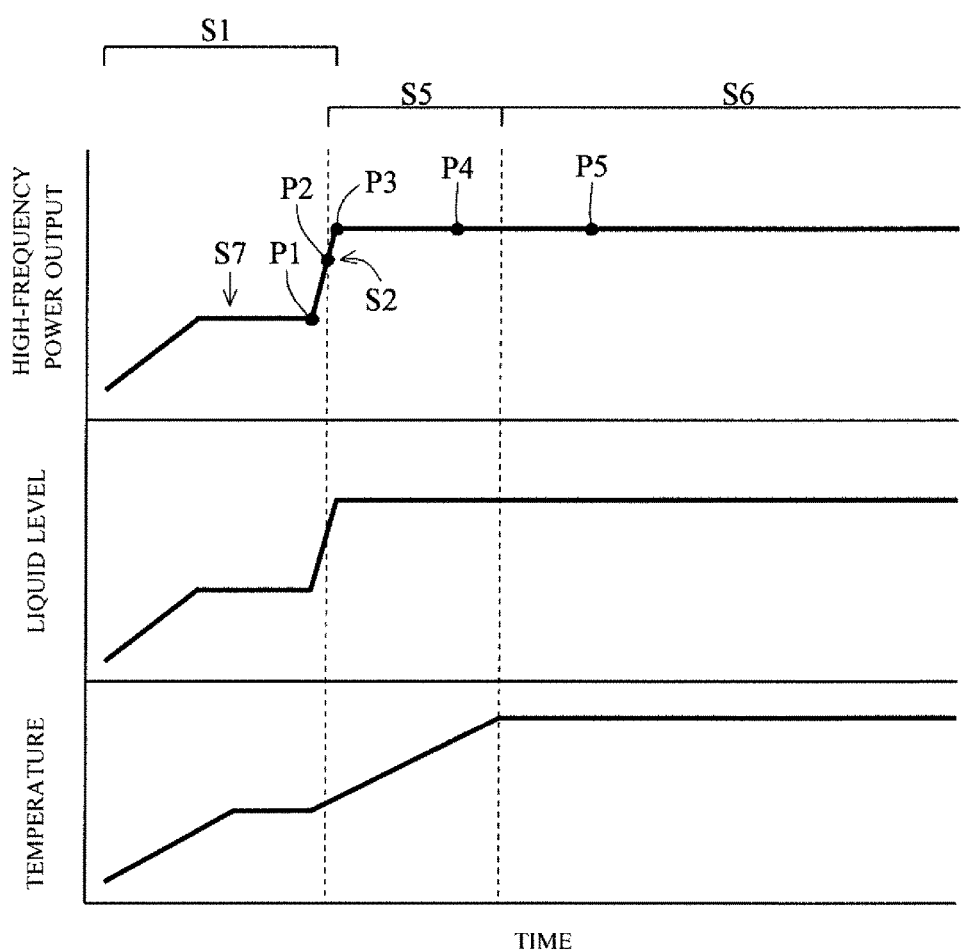
FIG. 2 is a diagram to show relationships among high-frequency power output of an induction heating device, a liquid level of a Si—C solution, and temperature of the Si—C solution, in association with time in a production process of a SiC single crystal by a solution growth method.

FIG. 2 is a diagram to show relationships among high-frequency power output of an induction heating device 3, a liquid level of a Si—C solution 7, and temperature of the Si—C solution 7, in association with time in a production process of a SiC single crystal by a solution growth method. Hereinafter, referring to FIG. 2, the production method of the present embodiment will be described.

The method for producing a SiC single crystal according to the present embodiment includes a preparation step, a power-output increasing step S1, a contact step S2, a melt-back step S3, and a growth step S4. The method for producing a SiC single crystal according to the present embodiment may further include a power-output maintaining step S5 and a meniscus forming step.

[Comparison with Conventional Production Method]

As described above, when causing melt-back, the Si—C seed crystal 8 is brought into contact with the Si—C solution at a temperature less than the crystal growth temperature, and the temperature of the Si—C solution 7 is increased. In this case, since the C concentration of the Si—C solution 7 becomes unsaturated as temperature rises, a portion of the Si—C seed crystal 8 which is in contact with the Si—C solution 7 melts, thereby causing melt-back.

In a conventional production method, the SiC seed crystal 8 is brought into contact with the liquid surface of the Si—C solution 7 before the high-frequency power output of the induction heating device 3 is increased to the crystal-growth high-frequency power output, for example, at a time point P1 in FIG. 2. Thereafter, the power output of the induction heating device 3 is increased so that the temperature of the Si—C solution 7 reaches the crystal growth temperature. This causes the above described melt-back to occur.

Increasing the power output of the induction heating device 3 causes magnetic flux to be generated in the crucible 5. The magnetic flux generates joule heat in the Si—C solution 7 through electromagnetic induction. The Joule heat increases the temperature of the Si—C solution 7. The magnetic flux generates not only Joule heat but also Lorentz force in the Si—C solution 7. The Lorentz force stirs the Si—C solution 7 and also acts as pinch force to raise the Si—C solution 7 in a hill shape.

As shown in FIG. 2, rising of the Si—C solution 7 by Lorentz force occurs instantly in response to increase in the power output. For that reason, when the SiC seed crystal 8 is brought into contact with the S—C solution 7 at, for example, a time point P1 in a conventional production method, the Si—C solution 7 rises and wets-up on the side surface of the SiC seed crystal 8.

On the other hand, even if the SiC seed crystal 8 is brought into contact with the Si—C solution 7 after the temperature of the Si—C solution 7 reaches the crystal growth temperature, for example, at a time point P5 in FIG. 2, it is not possible to perform melt-back. When the temperature of the Si—C solution 7 has already reached the crystal growth temperature, the C concentration of the Si—C solution 7 is saturated. For that reason, even if the SiC seed crystal 8 is brought into contact with the Si—C solution 7, the SiC seed crystal 8 will not melt.

In the present embodiment, after the high-frequency power output of the induction heating device 3 is increased and the Si—C solution 7 is raised to some extent (for example at a time point P2), the seed shaft 6 is moved down to bring the SiC seed crystal 8 into contact with the liquid surface of the Si—C solution 7. The rate of temperature increase of the Si—C solution 7 by Joule heat is much slower than the rising velocity of the Si—C solution 7 by Lorentz force. Therefore, in the production method of the present embodiment, the SiC seed crystal 8 comes into contact with the Si—C solution 7 before the Si—C solution 7 reaches the crystal growth temperature. Since the temperature of the Si—C solution 7 increases even after the SiC seed crystal 8 comes into contact with the Si—C solution 7, the C concentration in the solution becomes unsaturated. For that reason, a part of the SiC seed crystal 8 melts, and melt-back occurs. On the other hand, wetting-up in association with liquid level rising by Lorentz force is suppressed. This is because the SiC seed crystal 8 is brought into contact with the Si—C solution 7 after the Si—C solution 7 has already been risen to some extent due to increase in the power output.

Hereinafter, the production method of the present embodiment will be described in detail.

[Preparation Step]

In a preparation step, a Si—C solution 7 is generated. First, a raw material of the Si—C solution 7 is accommodated in a crucible 5. The crucible 5 in which the raw material is accommodated is disposed on an upper surface of a rotating device 20 in a chamber 2. After the crucible 5 is accommodated in the chamber 2, an inert gas, such as argon gas is charged in the chamber 2. Further, the crucible 5 and the raw material of the Si—C solution 7 are heated to a temperature equal to or higher than the melting point of the raw material of the Si—C solution 7 by the induction heating device 3. Heating the crucible 5 containing carbon causes carbon to dissolve into a melt from the crucible 5. As a result of that, the Si—C solution 7 is generated.

[Power-Output Increasing Step S1]

A power-output increasing step S1 is carried out after the preparation step. In the power-output increasing step S1, high-frequency power output of the induction heating device 3 is increased to the power output which increases the Si—C solution 7 to a crystal growth temperature. This heats the Si—C solution 7 to the crystal growth temperature. Further, Lorentz force is generated in the Si—C solution 7, and the Si—C solution 7 rises into a hill shape.

The rising velocity of the Si—C solution 7 is much faster than the rate of temperature increase of the Si—C solution 7. For that reason, when the high-frequency power output of the induction heating device 3 is increased, first, the liquid level of the Si—C solution 7 will rise. Next, the temperature of the Si—C solution will increase.

The rate of increasing the high-frequency power output of the induction heating device 3 in the power-output increasing step S1 can be changed according to the thickness of melt-back. As the rate of increasing the high-frequency power output increases, the temperature increasing rate of the Si—C solution 7 increases accordingly. When the temperature increasing rate of the Si—C solution 7 is large, it is possible to perform melt-back more reliably. By controlling the rate of increasing the high-frequency power output, it is possible to control the temperature increasing rate of the Si—C solution 7 in the melt-back step described later, to be within a preferable range.

[Contact Step S2]

In a contact step S2, the seed shaft 6 is moved down to bring the SiC seed crystal 8 into contact with the Si—C solution 7.

The contact step S2 is carried out in the course of the power-output increasing step S1 (for example, at a time point P2). The contact step S2 is carried out when the high-frequency power output exceeds 80% of the high-frequency power output in the crystal growth step. In short, after the Si—C solution 7 has risen to some extent due to the increase of high-frequency power output, the Si—C seed crystal 8 is brought into contact with the Si—C solution 7. As a result, wetting-up of the Si—C solution 7 is suppressed. Further, the temperature of the Si—C solution 7 in the contact step S2 is less than the crystal growth temperature. Increasing the temperature of the Si—C solution 7 to the crystal growth temperature after the contact step S2 makes it possible to perform melt-back. The high-frequency power output in the contact step S2 is more preferably not less than 85% of the crystal-growth high-frequency power output, and further preferably not less than 90% thereof.

The contact step S2 may be carried out after the power-output increasing step S1 (for example, at a time point P4). In this case, since the high-frequency power output of the induction heating device 3 is a crystal-growth high-frequency power output, the Si—C solution has already risen sufficiently. For that reason, carrying out the contact of the SiC seed crystal 8 after the power-output increasing step S1 will further suppress wetting-up of the Si—C solution 7. When carrying out the contact step S2 after the power-output increasing step S1, it is carried out before the temperature of the Si—C solution 7 reaches the crystal growth temperature. This makes it possible to perform melt-back.

The contact step S2 may be carried out at the end of the power-output increasing step S1 (for example, at a time point P3). In this case, the high-frequency power output of the induction heating device 3 is the crystal-growth high-frequency power output, and the temperature of the Si—C solution 7 is lower than that at a time point P4. For that reason, it is possible to perform melt-back in a larger amount while suppressing the wetting-up of the C—Si solution 7. The time point for carrying out the contact step S2 can be appropriately selected from the above described time points according to the thickness of melt-back to be performed.

[Melt-Back Step S3]

The temperature of the Si—C solution 7 in the contact step S2 is less than the crystal growth temperature. After the contact step S2, the temperature of the Si—C solution 7 keeps on increasing to the crystal growth temperature. Since the C concentration of the Si—C solution 7 becomes unsaturated as the temperature increases, a portion of the SiC seed crystal 8 which is in contact with the Si—C solution 7 melts, causing melt-back. In FIG. 2, by supposing that the contact step S2 is carried out at the time point P2, the melt-back step S3 is illustrated. When the contact step S2 is carried out at the time point P3 of FIG. 2, the melt-back step S3 will start at the time point P3.

[Growth Step S4]

After the temperature of the Si—C solution 7 reaches the crystal growth temperature, the growth step S4 is carried out. In the growth step S4, a SiC single crystal is grown on the crystal growth surface of the SiC seed crystal 8 at the crystal growth temperature. Specifically, a vicinity region of the SiC seed crystal 8 in the Si—C solution 7 is supercooled to cause the SiC in the vicinity region to be oversaturated. As a result, the SiC single crystal is grown on the SiC seed crystal 8. The method of supercooling the vicinity region of the SiC seed crystal 8 in the Si—C solution 7 is not particularly limited. For example, the induction heating device 3 may be controlled such that the temperature of the vicinity region of the SiC seed crystal 8 in the Si—C solution 7 is lower than the temperature of other regions.

By setting the crystal growth temperature at more than 1500° C., it is possible to increase the growth rate of SiC single crystal. By setting the crystal growth temperature at less than 2100° C., it is possible to suppress vaporization of the Si—C solution 7. Therefore, the crystal growth temperature is preferably 1500 to 2100° C. The lower limit of the crystal growth temperature is more preferably 1600° C., and further preferably 1700° C. The upper limit of the crystal growth temperature is preferably 2050° C., and further preferably 2000° C.

The crystal growth may be performed while keeping the temperature constant, or increasing the temperature. By performing crystal growth while increasing the temperature, it is possible to adjust the degree of supersaturation of C concentration in the Si—C solution 7 to be within an appropriate range. For that reason, it is possible to suppress generation of SiC polycrystals.

In the case of the production method according to the above described steps, it is possible to suppress the Si—C solution 7 from wetting-up onto the side surface of the SiC seed crystal 8. For that reason, generation of SiC polycrystals can be suppressed.

[Other Steps]

The method for producing a SiC single crystal of the present embodiment may further include the following steps.

[Power-Output Maintaining Step S5]

The production method of the present embodiment may include a power-output maintaining step S5 before the contact step S2 during the above described power output increasing step S1. In the power-output maintaining step S5, the high-frequency power output of the induction heating device 3 is kept for a predetermined time period in a state lower than the crystal-growth high-frequency power output. The temperature of the Si—C solution 7 in the power-output maintaining step S5 is not less than the melting point of the raw material of the Si—C solution 7. By maintaining the high-frequency power output of the induction heating device 3, the temperature of the Si—C solution 7 is maintained at constant. This facilities to achieve a uniform concentration of the Si—C solution 7 in the crucible 5. The power-output maintaining step S5 may be carried out multiple times, and the temperature may be increased in a stepwise manner. In the power-output maintaining step S5, the temperature of the Si—C solution 7 is preferably sufficiently higher than the melting point of Si. Therefore, the lower limit of the temperature of the Si—C solution 7 in the power-output maintaining step S5 is preferably 1450° C., and more preferably 1500° C. When the temperature of the Si—C solution 7 in the power-output maintaining step S5 is sufficiently lower than the crystal growth temperature of the Si—C solution 7, it is possible to perform melt-back more reliably. Therefore, the upper limit of the temperature of the Si—C solution 7 in the power-output maintaining step S5 is preferably 1700° C., and more preferably 1600° C.

[Meniscus Forming Step]

The production method of the present embodiment may include a meniscus forming step after the contact step S2. In the meniscus forming step, the SiC seed crystal 8 which is in contact with the Si—C solution 7 is pulled up to above the liquid level of the Si—C solution 7, to form a meniscus. By forming the meniscus, it is possible to further suppress wetting-up of the Si—C solution 7. The lower limit of meniscus height is preferably 0.1 mm, and more preferably 0.5 mm. The upper limit of the meniscus height is preferably 4.0 mm, and more preferably 3.0 mm.

EXAMPLES

Example 1

In the present example, the production apparatus 1 shown in FIG. 1 was used. In the present example, the crucible 5 was a graphite crucible, the induction heating device 3 was a high-frequency coil, the seed shaft 6 was made of graphite, and the chamber 2 was a water cooled stainless chamber.

The raw material of the Si—C solution was charged in the graphite crucible such that Si:Cr=0.5:0.5 by atomic ratio. The interior of the production apparatus was replaced by argon gas. Replacement of the atmosphere in the production apparatus was performed by utilizing a gas inlet port and a gas outlet port. The graphite crucible and the raw material of the Si—C solution were heated by the high-frequency coil to prepare a Si—C solution.

In the present example, a temperature gradient was formed such that an upper part of the Si—C solution has a lower temperature. The temperature gradient was formed by controlling positional relationship between the graphite crucible and the high-frequency coil. Specifically, a temperature gradient was formed by arranging such that a central part of the Si—C solution is located at a position lower than a center of the height of the high-frequency coil. The temperature gradient was confirmed by inserting a thermocouple separately in the Si—C solution in advance, and measuring temperature.

In the present example, the crystal growth temperature was 1897° C., and the corresponding high-frequency power output of the induction heating device was 15 kW. Immediately after the high-frequency power output of the induction heating device was increased to 15 kW, the seed shaft holding a SiC seed crystal was moved downward, to bring the SiC seed crystal into contact with the Si—C solution. At this moment, the temperature of the Si—C solution was 1687° C. Regardless of that the high-frequency power output (15 kW) of the induction heating device corresponded to the case in which the temperature of the Si—C solution was 1897° C., the temperature of the Si—C solution upon contact was lower than 1897° C. This is because the increase of the temperature of the Si—C solution was slower compared with the increase of the high-frequency power output of the induction heating device. The SiC seed crystal used was a SiC single crystal having 4H polytype, and the lower surface (crystal growth surface) of the SiC seed crystal was (0 0 0 −1). The thickness of the SiC seed crystal was 445 µm. After the SiC seed crystal was brought into contact with the Si—C solution, the SiC seed crystal was pulled up to form a meniscus. The meniscus height was 2 mm. The high-frequency power output of the induction heating device was maintained at 15 kW, to grow a SiC single crystal. The growth time was 20 hours.

Example 2

A SiC seed crystal having a thickness of 425 µm was used. Further, the meniscus was 4 mm. Other conditions were the same as those of Example 1 to produce a SiC single crystal.

Example 3

A SiC seed crystal having a thickness of 490 µm was used. Further, the contact step was carried out at a time point when the high-frequency power output of the induction heating device in the power-output increasing step was 81% of the crystal-growth high-frequency power output. In other words, the high-frequency power output of the induction heating device when the SiC seed crystal was brought into contact with the Si—C solution was 12.2 kW. A SiC single crystal was produced with other conditions being the same as those of Example 1.

Example 4

A SiC seed crystal having a thickness of 450 µm was used. Further, no meniscus was formed (meniscus height was 0 mm). A SiC single crystal was produced with other conditions being the same as those of Example 1.

Comparative Example

In Comparative Example, the contact step was carried out at a time point at which the high-frequency power output of the induction heating device in the power-output increasing step was 80% of the crystal-growth high-frequency power output. In other words, the high-frequency power output of the induction heating device when the SiC seed crystal was brought into contact with the Si—C solution was 12 kW. The temperature of the Si—C solution at this time was 1687° C. After the contact step, the high-frequency power output was increased to 15 kW to carry out the power-output increasing step. A SiC single crystal was produced with other conditions being the same as those in Example 1.

[Evaluation Results]

Each measurement condition and evaluation result are shown in Table 1. Presence or absence of wetting-up was confirmed by visual inspection after a SiC single crystal was produced at each condition. In the table, "ND" indicates that no wetting-up was confirmed, and "D" indicates that wetting-up was confirmed.

TABLE 1

| | Example 1 | Example 2 | Example 3 | Example 4 | Comparative Example |
|---|---|---|---|---|---|
| Power output during contact [kW] | 15 | 15 | 12.2 | 15 | 12 |
| Temperature during contact [° C.] | 1687 | 1687 | 1687 | 1687 | 1687 |
| Meniscus height [mm] | 2 | 4 | 2 | 0 | 2 |
| Power output during crystal growth [kW] | 15 | 15 | 15 | 15 | 15 |
| Temperature during crystal growth [° C.] | 1897 | 1897 | 1897 | 1897 | 1897 |
| Crystal growth time [h] | 20 | 20 | 20 | 20 | 20 |
| Seed crystal thickness [µm] | 445 | 425 | 490 | 450 | 445 |
| Crystal growth thickness [µm] | 3309 | 3797 | 3115 | 2236 | 2373 |
| Presence or absence of wetting-up | ND | ND | ND | ND | D |

Figure 3:
FIG. 3 shows external appearance of a SiC single crystal fabricated under conditions of Example 1.
Figure 4:
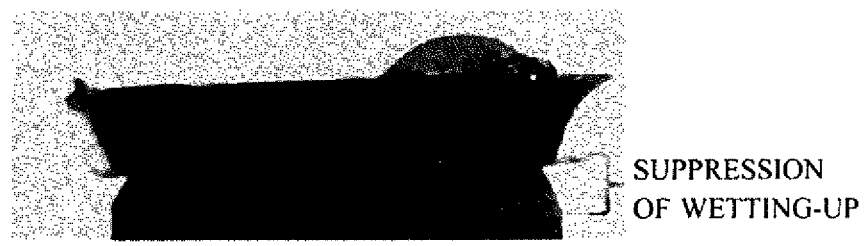
FIG. 4 shows external appearance of a SiC single crystal fabricated under conditions of Example 2.

In Examples 1 to 4, the contact step was carried out when the high-frequency power output of the induction heating device was larger than 80% of the crystal-growth high-frequency power output, and the temperature of the Si—C solution was less than the crystal growth temperature. For that reason, wetting-up of the Si—C solution was suppressed (see Table 1, FIGS. 3 and 4).

Figure 5:
FIG. 5 shows external appearance of a SiC single crystal fabricated under conditions of Comparative Example.

On the other hand, in Comparative Example, the contact step was carried out at a time point when the high-frequency power output of the induction heating device was 80% of the crystal-growth high-frequency power output. For that reason, wetting-up of the Si—C solution was confirmed (see Table 1 and FIG. 5). This is considered to be because the high-frequency power output of the induction heating device was increased to the high-frequency power output corresponding to the crystal growth temperature after the contact step, and thereby the liquid level of the Si—C solution further rose.

Embodiments of the present invention have been described above. However, the above described embodiments are merely examples for carrying out the present invention. Therefore, the present invention will not be limited to the above described embodiments, and can be carried out by appropriately modifying the above described embodiments within a range not departing from the spirit thereof.

REFERENCE SIGNS LIST

1 Production apparatus
3 Induction heating device
7 Si—C solution
8 SiC seed crystal

The invention claimed is:
1. A method for producing a SiC single crystal by a solution growth method, comprising:

a power-output increasing step of increasing high-frequency power output of an induction heating device to crystal-growth high-frequency power output;

a contact step of bringing a SiC seed crystal into contact with a Si—C solution when the high-frequency power output of the induction heating device is larger than 80% of the crystal-growth high-frequency power output, and a temperature of the Si—C solution is less than a crystal growth temperature; and a growth step of growing a SiC single crystal at the crystal growth temperature, wherein crystal growth is performed while increasing the crystal growth temperature, in the growth step.

2. A method for producing a SiC single crystal by a solution growth method, comprising:

a power-output increasing step of increasing high-frequency power output of an induction heating device to crystal-growth high-frequency power output;

a contact step of bringing a SIC seed crystal into contact with a Si—C solution when the high-frequency power output of the induction heating device is larger than 80% of the crystal-growth high-frequency power output, and a temperature of the Si—C solution is less than a crystal growth temperature;

a growth step of growing a SiC single crystal at the crystal growth temperature; and a power-output maintaining step of maintaining the high-frequency power output of the induction heating device for a predetermined period of time in a state lower than the crystal-growth high-frequency power output, before the contact step and during the power-output increasing step, wherein crystal growth is performed while increasing the crystal growth temperature, in the growth step.

3. A method for producing a SiC single crystal by a solution growth method, comprising:

a power-output increasing step of increasing high-frequency power output of an induction heating device to crystal-growth high-frequency power output;

a contact step of bringing a SIC seed crystal into contact with a Si—C solution when the high-frequency power output of the induction heating device is larger than 80% of the crystal-growth high-frequency power output, and a temperature of the Si—C solution is less than a crystal growth temperature;

a growth step of growing a SiC single crystal at the crystal growth temperature; and a meniscus forming step of moving the SiC seed crystal upward to form a meniscus, after the contact step, wherein crystal growth is performed while increasing the crystal growth temperature, in the growth step.

4. A method for producing a SIC single crystal by a solution growth method, comprising:

a power-output increasing step of increasing high-frequency power output of an induction heating device to crystal-growth high-frequency power output;

a contact step of bringing a SiC seed crystal into contact with a Si—C solution when the high-frequency power output of the induction heating device is larger than 80% of the crystal-growth high-frequency power output, and a temperature of the Si—C solution is less than a crystal growth temperature;

a growth step of growing a SiC single crystal at the crystal growth temperature;

a power-output maintaining step of maintaining the high-frequency power output of the induction heating device for a predetermined period of time in a state lower than the crystal-growth high-frequency power output, before the contact step and during the power-output increasing step; and a meniscus forming step of moving the SiC seed crystal upward to form a meniscus, after the contact step, wherein crystal growth is performed while increasing the crystal growth temperature, in the growth step.

* * * * *